(12) United States Patent
Park et al.

(10) Patent No.: US 12,745,521 B2
(45) Date of Patent: Sep. 22, 2026

(54) DISPLAY APPARATUS AND METHOD OF MANUFACTURING THE SAME

(71) Applicant: SAMSUNG DISPLAY CO., LTD., Yongin-si (KR)

(72) Inventors: Youngok Park, Yongin-si (KR); Seungsoo Ryu, Yongin-si (KR); Heeju Woo, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 532 days.

(21) Appl. No.: 18/202,187

(22) Filed: May 25, 2023

(65) Prior Publication Data

US 2023/0403895 A1 Dec. 14, 2023

(30) Foreign Application Priority Data

Jun. 14, 2022 (KR) ........................ 10-2022-0072352

(51) Int. Cl.
*H10K 59/131* (2023.01)
*G09G 3/3233* (2016.01)
*H10K 59/12* (2023.01)

(52) U.S. Cl.
CPC ......... *H10K 59/131* (2023.02); *G09G 3/3233* (2013.01); *H10K 59/1201* (2023.02); *G09G 2300/0842* (2013.01)

(58) Field of Classification Search
CPC .. H10K 59/131; H10K 59/1201; H10K 71/00; H10W 72/30
See application file for complete search history.

(56) References Cited

U.S. PATENT DOCUMENTS

| | | | |
|---|---|---|---|
| 5,516,727 | A | 5/1996 | Broom |
| 7,602,070 | B2 | 10/2009 | Tong et al. |
| 9,324,670 | B2 | 4/2016 | Hwang et al. |
| 11,049,924 | B2 | 6/2021 | Jang |

(Continued)

FOREIGN PATENT DOCUMENTS

| | | | |
|---|---|---|---|
| KR | 100896127 | B1 | 1/2009 |
| KR | 1020200032792 | A | 3/2020 |

(Continued)

OTHER PUBLICATIONS

A. Elrefaey et al; "Direct Glass-to-Metal Joining by Simultaneous Anodic Bonding and Soldering with Activated Liquid Tin Solder"; Journal of Materials Processing Technology 214 (2014) 2716-2722.

(Continued)

*Primary Examiner* — Douglas M Menz
(74) *Attorney, Agent, or Firm* — CANTOR COLBURN LLP

(57) ABSTRACT

A method of manufacturing a display apparatus in which the occurrence of a short circuit may be reduced includes forming a pad in a peripheral area of a substrate having a display area and the peripheral area outside the display area, disposing a first conductive particle on a surface of the pad, disposing a second conductive particle on a surface of a bump included in an electronic chip package, the surface of the bump facing the surface of the pad, and electrically connecting the pad to the bump by bringing the first conductive particle into contact with the second conductive particle.

12 Claims, 14 Drawing Sheets

(56) References Cited

U.S. PATENT DOCUMENTS

| | | | | |
|---|---|---|---|---|
| 11,605,695 | B2 | 3/2023 | Kim | |
| 2002/0105078 | A1* | 8/2002 | Lee | H05K 3/323 257/773 |
| 2021/0343951 | A1 | 11/2021 | Ju | |
| 2022/0262754 | A1* | 8/2022 | Sakuma | H01L 21/4825 |

FOREIGN PATENT DOCUMENTS

| | | | |
|---|---|---|---|
| KR | 1020210027579 | A | 3/2021 |
| KR | 20210130152 | A | 10/2021 |
| KR | 20210135384 | A | 11/2021 |

OTHER PUBLICATIONS

Yun Hwan Jo; "Synthesis and Characterization of Low Temperature Sn Nanoparticles for the Fabrication of Highly Conductive Ink"; Nanotechnology 22 (2011) 225701 (8pp).

* cited by examiner 600
610
620
630
OLED
510
520
530
1310
1320
BP
1100
PD
PA
DA
420
310
312
Cst
440
221
222
223
TFT
210
430
UIL
OL
IL3
IL2
IL1
100
I
I'
II
II'
z
x,y

FIG. 7A 600 610 620 630 OLED 510 520 530 B 1210 PDUS PD PA DA II' II I' I 420 Cst 310 312 440 221 222 223 TFT 210 430 UIL OL IL3 IL2 IL1 100 z x,y

FIG. 11

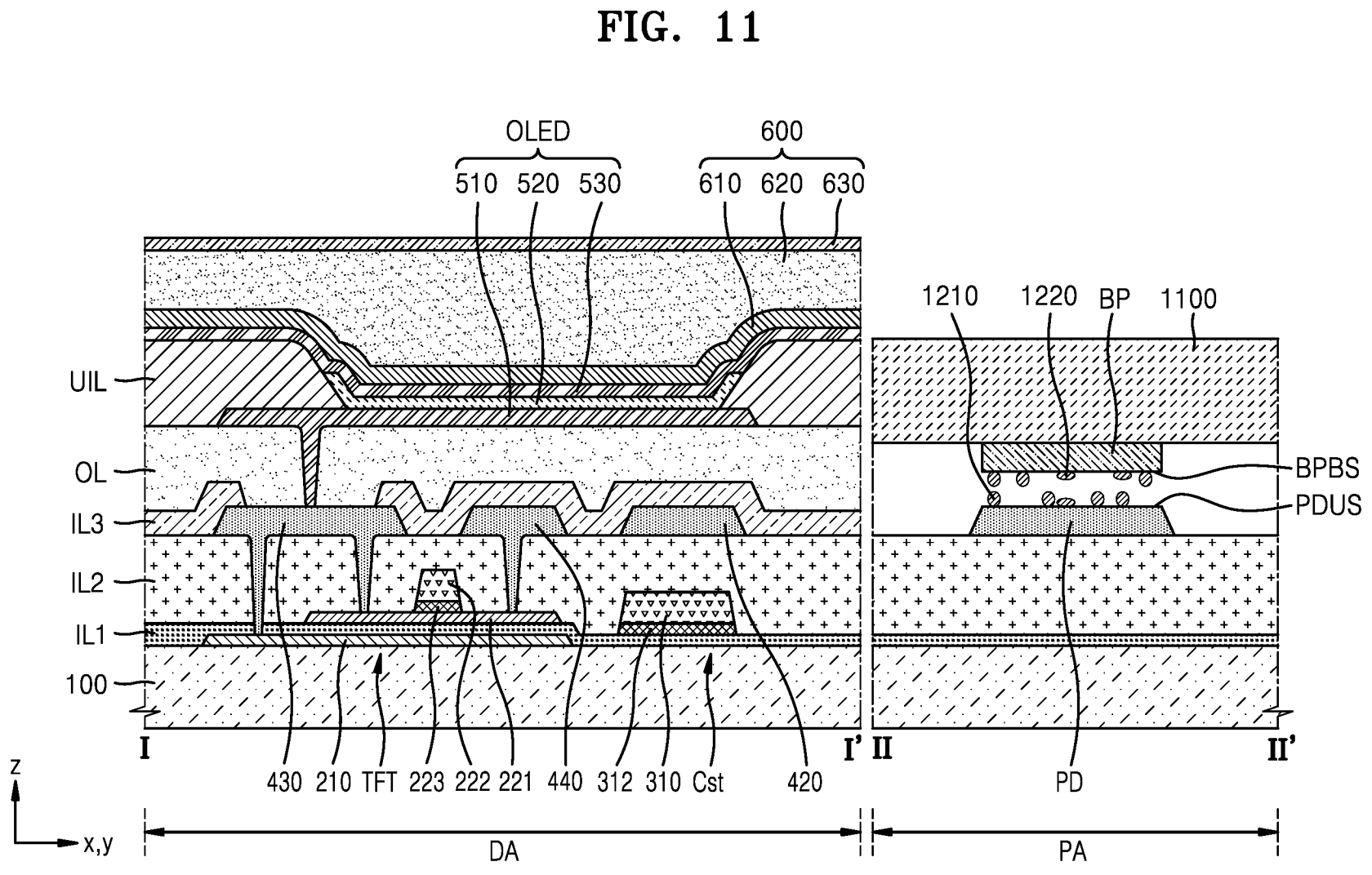

600
610 620 630
OLED
510 520 530
1210 1220 BP 1100
BPBS
PDUS
PD
PA
DA
II II'
I I'
420
440
221
222
223
310 Cst
312
210 TFT
430
UIL
OL
IL3
IL2
IL1
100
z
x,y

DISPLAY APPARATUS AND METHOD OF MANUFACTURING THE SAME

This application claims priority to Korean Patent Application No. 10-2022-0072352, filed on Jun. 14, 2022, and all the benefits accruing therefrom under 35 U.S.C. § 119, the content of which in its entirety is herein incorporated by reference.

BACKGROUND

1. Field

Embodiments relate to a display apparatus and a method of manufacturing the same, and more particularly, to a display apparatus, in which the occurrence of a short circuit in a pad portion may be reduced, and a method of manufacturing the display apparatus.

2. Description of the Related Art

A display apparatus receives information about an image and displays the image. The display apparatus may include a display panel for displaying the image or the like and an electronic chip package or a printed circuit board for providing information about the image or the like. To receive the information about an image or the like, the display panel includes, at an edge thereof, pads that are electrically connected to display elements, and the pads are electrically connected to bumps of the electronic chip package or pads of the printed circuit board. In this case, the bumps of the electronic chip package or the pads of the printed circuit board are desired to be electrically connected only to preset pads of the display panel, which correspond thereto.

SUMMARY

In a display apparatus of the related art, bumps of an electronic chip package or pads of a printed circuit board are electrically connected not only to pads of a display panel, which correspond thereto, but also to pads adjacent thereto, and thus, a short circuit may occur. In addition, in the display apparatus of the related art, adjacent pads of the display panel are electrically connected to each other, and thus, a short circuit may occur.

Embodiments include a display apparatus, in which the occurrence of a short circuit in a pad portion may be reduced, and a method of manufacturing the display apparatus. However, this is merely one of embodiments, and the scope of the disclosure is not limited thereto.

Additional features will be set forth in part in the description which follows and, in part, will be apparent from the description, or may be learned by practice of the presented embodiments of the disclosure.

According to an embodiment of the disclosure, a method of manufacturing a display apparatus includes forming a pad in a peripheral area of a substrate in which a display area and the peripheral area outside the display area are defined, disposing a first conductive particle on a surface of the pad, disposing a second conductive particle on a surface of a bump included in an electronic chip package, the surface of the bump facing the surface of the pad, and electrically connecting the pad to the bump by bringing the first conductive particle into contact with the second conductive particle.

In an embodiment, the electrically connecting the pad to the bump may include welding the first conductive particle to the second conductive particle.

In an embodiment, the first conductive particle may include a same material as a material of the second conductive particle.

In an embodiment, the first conductive particle and the second conductive particle may each include tin.

In an embodiment, when the first conductive particle has a spherical shape, a diameter of the first conductive particle may be about 7 nanometers (nm) to about 24 nm, and the electrically connecting the pad to the bump may include welding the first conductive particle to the second conductive particle at a temperature greater than or equal to about 120 degrees Celsius (° C.) and less than about 210° C.

In an embodiment, the diameter of the first conductive particle may be about 7 nm to about 11 nm, and the electrically connecting the pad to the bump may include welding the first conductive particle to the second conductive particle at a temperature greater than or equal to about 120° C. and less than about 170° C.

In an embodiment, when the second conductive particle has a spherical shape, a diameter of the second conductive particle may be about 7 nm to about 24 nm, and the electrically connecting the pad to the bump may include welding the first conductive particle to the second conductive particle at a temperature greater than or equal to 120° C. and less than about 210° C.

In an embodiment, the diameter of the second conductive particle may be about 7 nm to about 11 nm, and the electrically connecting the pad to the bump may include welding the first conductive particle to the second conductive particle at a temperature greater than or equal to about 120° C. and less than about 170° C.

In an embodiment, when a cross-section of the first conductive particle has an oval shape, the cross-section being perpendicular to the substrate, a long axis length of the oval shape may be about 7 nm to about 24 nm, and the electrically connecting the pad to the bump may include welding the first conductive particle to the second conductive particle at a temperature greater than or equal to about 120° C. and less than about 210° C.

In an embodiment, the long axis length of the oval shape may be about 7 nm to about 11 nm, and the electrically connecting the pad to the bump may include welding the first conductive particle to the second conductive particle at a temperature greater than or equal to about 120° C. and less than about 170° C.

In an embodiment, when a cross-section of the second conductive particle has an oval shape, the cross-section being perpendicular to the substrate, a long axis length of the oval shape may be about 7 nm to about 24 nm, and the electrically connecting the pad to the bump may include welding the first conductive particle to the second conductive particle at a temperature greater than or equal to about 120° C. and less than about 210° C.

In an embodiment, the long axis length of the oval shape may be about 7 nm to about 11 nm, and the electrically connecting the pad to the bump may include welding the first conductive particle to the second conductive particle at a temperature greater than or equal to about 120° C. and less than about 170° C.

According to an embodiment of the disclosure, a display apparatus includes a substrate including a display area, a peripheral area outside the display area, and a pad arranged in the peripheral area, an electronic chip package including a bump, and a first connection conductive particle arranged between the pad and the bump to electrically connect the pad to the bump and having an interface therein.

In an embodiment, the first connection conductive particle may include a first conductive particle contacting the pad and a second conductive particle contacting the bump. The first conductive particle may be in surface contact with the second conductive particle.

In an embodiment, the display apparatus may further include a second connection conductive particle arranged between the pad and the bump as a single body.

In an embodiment, when viewed from a direction perpendicular to the substrate, an area of the first connection conductive particle may be greater than an area of the second connection conductive particle.

In an embodiment, the second connection conductive particle may include a same material as a material of the first conductive particle.

In an embodiment, the second connection conductive particle may include a same material as a material of the second conductive particle.

In an embodiment, the pad may be provided in plural, and the display apparatus may further include a third conductive particle arranged in an area between a plurality of pads of the substrate.

In an embodiment, the third conductive particle may include a same material as that of the first conductive particle.

In an embodiment, the bump may be provided in plural, and the display apparatus may further include a fourth conductive particle arranged in an area between a plurality of bumps of the electronic chip package.

In an embodiment, the fourth conductive particle may include a same material as a material of the second conductive particle.

Other features and advantages than those described above will become apparent from the following drawings, claims, and detailed description of the disclosure.

BRIEF DESCRIPTION OF THE DRAWINGS

The above and other features and advantages of embodiments of the disclosure will be more apparent from the following description taken in conjunction with the accompanying drawings, in which:

FIGS. 6 to 11 are cross-sectional views schematically illustrating an embodiment of a process of manufacturing a portion of the display apparatus of FIG. 4.

DETAILED DESCRIPTION

Figure 1A:
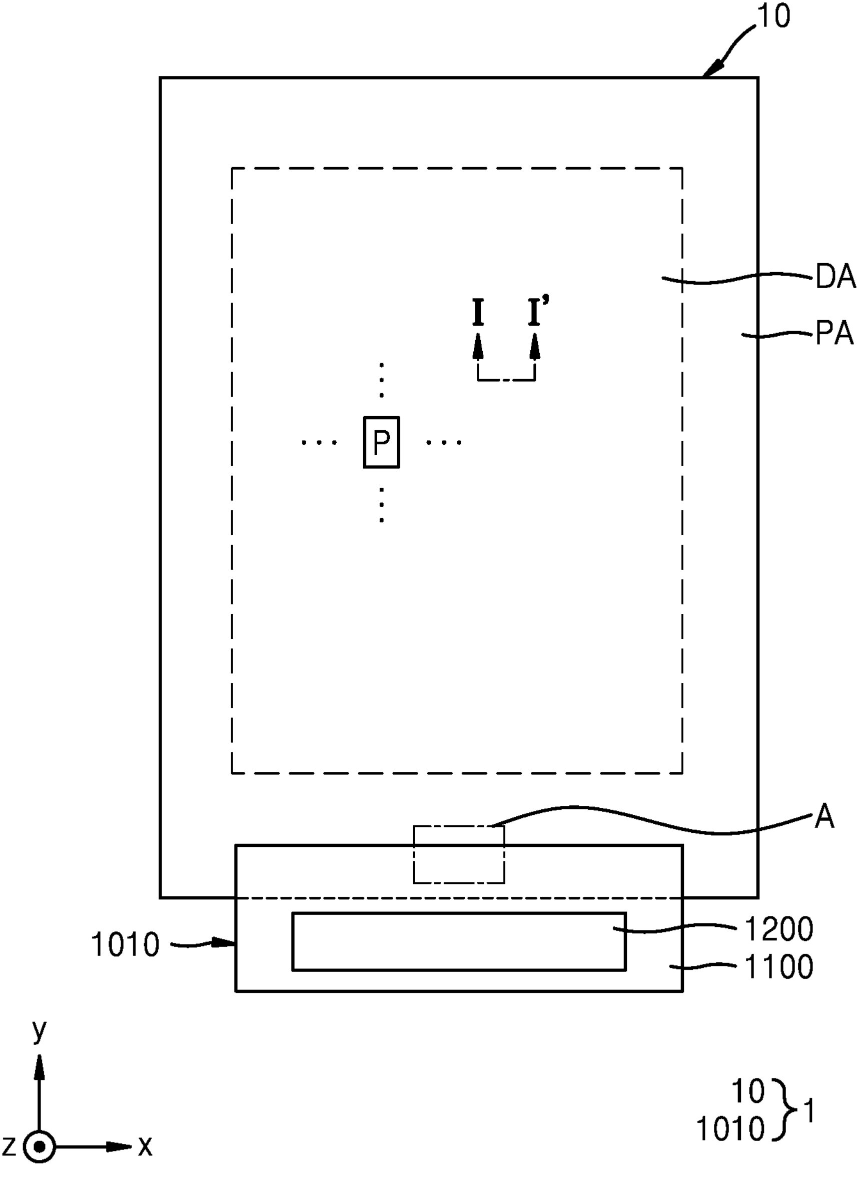
FIG. 1A is a plan view schematically illustrating an embodiment of a portion of a display apparatus.

Reference will now be made in detail to embodiments, embodiments of which are illustrated in the accompanying drawings, where like reference numerals refer to like elements throughout. In this regard, the illustrated embodiments may have different forms and should not be construed as being limited to the descriptions set forth herein. Accordingly, the embodiments are merely described below, by referring to the drawing figures, to explain features of the description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the disclosure allows for various changes and numerous embodiments, illustrative embodiments will be illustrated in the drawings and described in detail in the written description. Effects and features of the disclosure, and methods of achieving them will be clarified with reference to embodiments described below in detail with reference to the drawings. However, the disclosure is not limited to the following embodiments and may be embodied in various forms.

Hereinafter, embodiments of the disclosure will be described in detail with reference to the accompanying drawings, where the same or corresponding components are denoted by the same reference numerals throughout and repeated descriptions thereof are omitted.

In the following embodiments, when various components such as layers, films, regions, plates, etc. are "on" other components, this includes not only a case where they are "on" other components, but also a case where another component is interposed therebetween. In addition, sizes of components in the drawings may be exaggerated or reduced for convenience of description. In an embodiment, because sizes and thicknesses of components in the drawings are arbitrarily illustrated for convenience of description, the disclosure is not limited thereto.

In the following embodiments, the x-axis, y-axis, and z-axis are not limited to three axes on a Cartesian coordinate system, and may be interpreted in a broad sense including them. In an embodiment, the x-axis, the y-axis, and the z-axis may be perpendicular to one another, or may represent different directions that are not perpendicular to one another.

In the following embodiments, although the terms "first," "second," etc. may be used to describe various components, these components should not be limited by these terms. These terms are only used to distinguish one component from another.

In the following embodiments, an expression used in the singular encompasses the expression of the plural, unless it has a clearly different meaning in the context.

In the following embodiments, the terms "include" and/or "comprise" specify the presence of stated features or components, but do not preclude the presence or addition of one or more other features or components.

In the specification, the expression "A and/or B" indicates only A, only B, or both A and B. In addition, the expression "at least one of A and B" indicates A, B, or A and B.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). The term "about" can mean within one or more standard deviations, or within ±30%, 20%, 10%, 5% of the stated value, for example.

Figure 2:
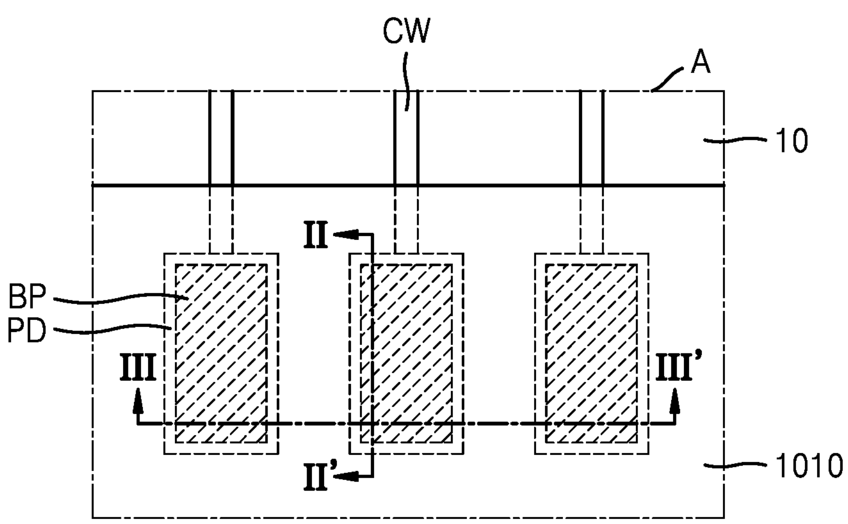
FIG. 2 is an enlarged plan view illustrating region A of FIG. 1A.

FIG. 1A is a plan view schematically illustrating an embodiment of a portion of a display apparatus 1. FIG. 2 is an enlarged plan view illustrating region A of FIG. 1A. As shown in FIG. 1A, the display apparatus 1 may include a display panel 10 and an electronic chip package 1010. The display panel 10 may display an image or the like, and the electronic chip package 1010 may provide information about the image or the like to the display panel 10.

The display panel 10 may include a display area DA, where a plurality of pixels P is arranged, and a peripheral area PA arranged outside the display area DA. In detail, the peripheral area PA may surround an entirety of the display area DA. Because the display panel 10 includes a substrate 100 (refer to FIG. 4), it may be stated that the substrate 100 includes the display area DA and the peripheral area PA. Hereinafter, for convenience, the substrate 100 is described as including the display area DA and the peripheral area PA.

Each pixel P of the display panel 10 is an area where light of a predetermined color may be emitted, and the display panel 10 may provide an image by light emitted from the pixels P. In an embodiment, each pixel P may emit red, green, or blue light, for example. However, the disclosure is not limited thereto, and each pixel P may emit various other colors.

As shown in FIG. 1A, the display area DA may have a polygonal shape including a quadrangular shape. In an embodiment, the display area DA may have a rectangular shape in which the horizontal length is greater than the vertical length, a rectangular shape in which the horizontal length is less than the vertical length, or a square shape, for example. In an alternative embodiment, the display area DA may have various shapes, such as an elliptical shape or a circular shape.

The peripheral area PA may be a non-display area where pixels are not arranged. A driver or the like for providing electrical signals or power to the pixels P may be arranged in the peripheral area PA. As shown in FIG. 2, a plurality of pads PD, which are areas to which the electronic chip package 1010 or a printed circuit board may be electrically connected, may be arranged in the peripheral area PA. The pads PD may be arranged apart from each other in the peripheral area PA, and the pads PD may be respectively and electrically connected to a plurality of connection wirings CW arranged in the peripheral area PA. The connection wirings CW may electrically connect signal lines, e.g., data lines (refer to FIG. 3) (or scan lines (refer to FIG. 3)), arranged in the display area DA to the pads PD.

Figure 1B:
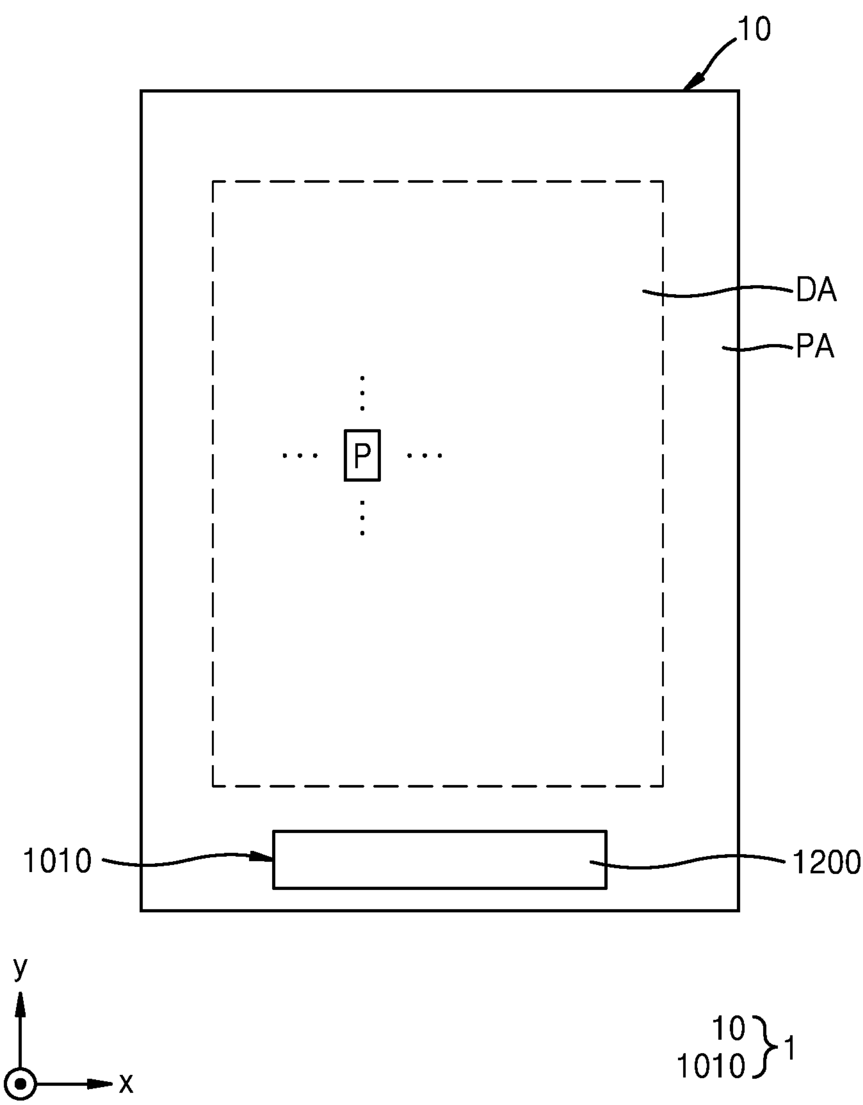
FIG. 1B is a plan view schematically illustrating an embodiment of a portion of a display apparatus.

The electronic chip package 1010 may be disposed over the plurality of pads PD. The electronic chip package 1010 may have a chip-on-film ("COF") structure. In detail, the electronic chip package 1010 may include an electronic chip 1200 and a body 1100 on which the electronic chip 1200 is disposed (e.g., mounted). The electronic chip 1200 may include an integrated circuit ("IC") chip, for example, and may be a data driving driver for generating data signals to be applied to data lines in the display area DA. The body 1100 may be a flexible film. However, the disclosure is not limited thereto. As shown in FIG. 1B, which is a plan view of the display apparatus 1 in an embodiment, the electronic chip package 1010 may not include the body 1100. In an embodiment, the electronic chip package 1010 may have a chip-on-panel ("COP") structure, for example. Hereinafter, for convenience, the electronic chip package 1010 is described as including the electronic chip 1200 and the body 1100 on which the electronic chip 1200 is disposed (e.g., mounted).

In detail, the electronic chip package 1010 may include bumps BP disposed under the body 1100, and the bumps BP of the electronic chip package 1010 may be respectively disposed over the plurality of pads PD. The bumps BP may be electrically connected to the electronic chip 1200. The plurality of pads PD may be electrically connected to the bumps BP of the electronic chip package 1010, which respectively correspond thereto, and accordingly, the display panel 10 may be electrically connected to the electronic chip package 1010. As shown in FIG. 1B, when the electronic chip package 1010 does not include the body 1100, the bumps BP may be disposed under the electronic chip 1200. In FIG. 2, for convenience of description, an area of each pad PD is greater than an area of the bump BP corresponding thereto, but the disclosure is not limited thereto. In an embodiment, the area of the pad PD may be less than the area of the bump BP corresponding thereto, and the area of the pad PD may be the same as the area of the bump BP corresponding thereto, for example. The plurality of pads PD may be electrically connected to the bumps BP of the electronic chip package 1010, which respectively correspond thereto, through first connection conductive particles and/or second connection conductive particles, and the first connection conductive particle and the second connection conductive particle are described below in detail.

Figure 3:
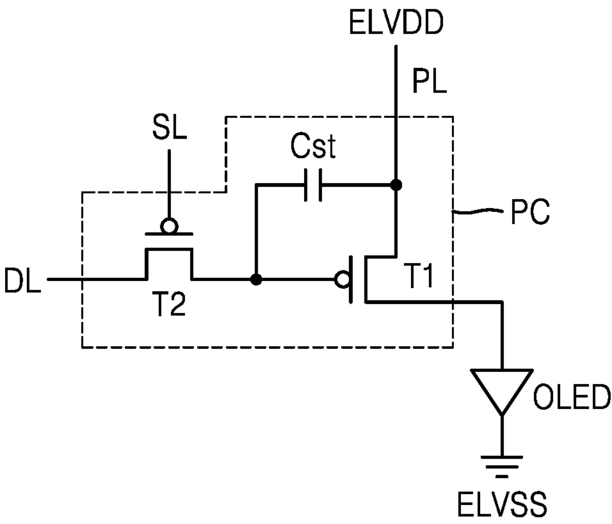
FIG. 3 is an equivalent circuit diagram illustrating an embodiment of a pixel included in a display apparatus.

FIG. 3 is an equivalent circuit diagram illustrating an embodiment of the pixel P included in the display apparatus 1. As shown in FIG. 3, the pixel P may include a pixel circuit PC and an organic light-emitting diode OLED electrically connected to the pixel circuit PC.

The pixel circuit PC may include a first transistor T1, a second transistor T2, and a storage capacitor Cst. The second transistor T2 may be a switching transistor, may be connected to a scan line SL and a data line DL, and may transmit a data voltage input through the data line DL to the first transistor T1, according to a switching voltage input through the scan line SL. The storage capacitor Cst may be connected to the second transistor T2 and a driving voltage line PL, and may store a voltage corresponding to a difference between a voltage received from the second transistor T2 and a first power voltage ELVDD supplied to the driving voltage line PL.

The first transistor T1 may be a driving transistor, may be connected to the driving voltage line PL and the storage capacitor Cst, and may control a driving current flowing from the driving voltage line PL to the organic light-emitting diode OLED, in response to a value of the voltage stored in the storage capacitor Cst. The organic light-emitting diode OLED may emit light having a predetermined luminance according to the driving current. An opposite electrode 530 (refer to FIG. 4) of the organic light-emitting diode OLED may receive a second power voltage ELVSS.

In FIG. 3, the pixel circuit PC includes two transistors and one storage capacitor, but the disclosure is not limited thereto. In an embodiment, the number of transistors or the number of storage capacitors may be variously changed according to a design of the pixel circuit PC, for example.

Figure 4:
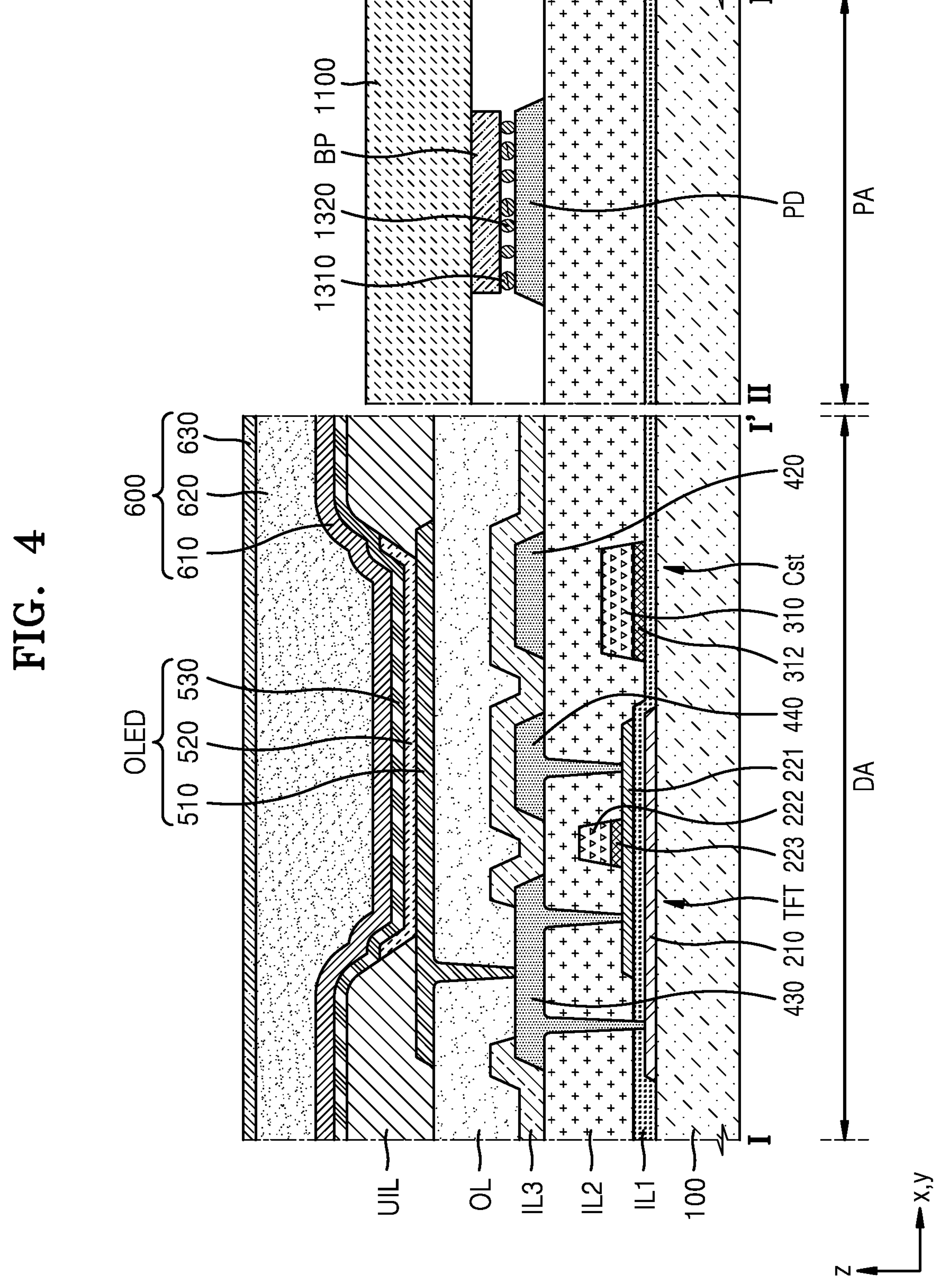
FIG. 4 is a cross-sectional view schematically illustrating an embodiment of a portion of a display apparatus.

FIG. 4 is a cross-sectional view schematically illustrating a portion of the display apparatus 1. In detail, FIG. 4 is a cross-sectional view schematically illustrating cross-sections of the display apparatus 1 taken along line I-I' of FIG. 1A and line II-II' of FIG. 2. As shown in FIG. 4, the display panel 10 of the display apparatus 1 in the illustrated embodiment includes the substrate 100. The substrate 100 may include various flexible or bendable materials. In an embodiment, the substrate 100 may include glass, metal, or polymer resin, for example. In addition, the substrate 100 may include polymer resin, such as polyethersulfone, polyacrylate, polyetherimide, polyethylene naphthalate, polyethylene terephthalate, polyphenylene sulfide, polyarylate, polyimide, polycarbonate, or cellulose acetate propionate. The substrate 100 may be variously modified. In an embodiment, the substrate 100 may have a multi-layered structure including two layers and a barrier layer arranged between the two layers, the two layers each including the above polymer resin, and the barrier layer including an inorganic material, such as silicon oxide, silicon nitride, or silicon oxynitride, for example.

A display element and a transistor TFT electrically connected to the display element may be disposed on the substrate 100. In FIG. 4, the organic light-emitting diode OLED is disposed over the substrate 100 as a display element. The description that the organic light-emitting diode OLED is electrically connected to the transistor TFT may indicate that a pixel electrode 510 is electrically connected to the transistor TFT.

The transistor TFT may include a semiconductor layer 221, a gate electrode 222, a first connection electrode 430, and a second connection electrode 440, the semiconductor layer 221 including amorphous silicon, polycrystalline silicon, an organic semiconductor material, or an oxide semiconductor material. In an embodiment, the first connection electrode 430 may be a source electrode, and the second connection electrode 440 may be a drain electrode, for example. In an alternative embodiment, according to the polarity of the transistor TFT, the first connection electrode 430 may be a drain electrode, and the second connection electrode 440 may be a source electrode. The gate electrode 222 may include various conductive materials and have various layer structures. In an embodiment, the gate electrode 222 may include a molybdenum (Mo) layer and an aluminum (Al) layer, for example. In an alternative embodiment, the gate electrode 222 may include a titanium nitride ($TiN_X$) layer, an Al layer, and/or a titanium (Ti) layer. Each of the first connection electrode 430 and the second connection electrode 440 may also include various conductive materials and have various layer structures. In an embodiment, each of the first connection electrode 430 and the second connection electrode 440 may include a Ti layer, an Al layer, and/or a copper (Cu) layer, for example.

To ensure insulation between the semiconductor layer 221 and the gate electrode 222, a gate insulating layer 223 may be arranged between the semiconductor layer 221 and the gate electrode 222, the gate insulating layer 223 including an inorganic material, such as silicon oxide, silicon nitride, and/or silicon oxynitride. In addition, a second insulating layer IL2 may be disposed on the gate electrode 222, and the first connection electrode 430 and the second connection electrode 440 may be disposed on the second insulating layer IL2. The second insulating layer IL2 includes an inorganic material, such as silicon oxide, silicon nitride, and/or silicon oxynitride. Each of the first connection electrode 430 and the second connection electrode 440 may be electrically connected to the semiconductor layer 221 through a contact hole defined in the second insulating layer IL2.

However, the disclosure is not limited thereto. In an embodiment, the transistor TFT may include only one of the first connection electrode 430 and the second connection electrode 440, or may not include both of the first connection electrode 430 and the second connection electrode 440, for example. In an embodiment, one transistor TFT may not include the second connection electrode 440, and another transistor TFT connected to the one transistor TFT may not include the first connection electrode 430, and the semiconductor layers 221 of the two transistors may be connected to each other, for example. The above connection structure may have the same effect as the effect achieved when one transistor includes the first connection electrode 430, another transistor includes the second connection electrode 440, and the first connection electrode 430 of the one transistor is connected to the second connection electrode 440 of the other transistor.

These insulating layers including an inorganic material may be formed by chemical vapor deposition ("CVD") or atomic layer deposition ("ALD"). This also applies to embodiments described below and modifications thereof.

The storage capacitor Cst may include a first electrode 310 and a second electrode 420. The first electrode 310 of the storage capacitor Cst may be formed by the same process as that of the gate electrode 222, and may include the same material as that of the gate electrode 222. An insulating layer 312 including the same material as that of the gate insulating layer 223 may be disposed under the first electrode 310. Because the insulating layer 312 under the first electrode 310 is formed together through the same mask process as that of the first electrode 310, a planar shape of the insulating layer 312 may be substantially the same as a planar shape of the first electrode 310. The second electrode 420 of the storage capacitor Cst may be formed by the same process as that of the first connection electrode 430 and the second connection electrode 440 of the transistor TFT, and may include the same material as that of the first connection electrode 430 and the second connection electrode 440.

The transistor TFT may include a lower metal layer 210 disposed under the semiconductor layer 221, and the lower metal layer 210 may be electrically connected to one of the first connection electrode 430 and the second connection electrode 440. In an embodiment, in FIG. 4, the lower metal layer 210 is electrically connected to the first connection electrode 430, and the lower metal layer 210 may be a type of a lower first connection electrode.

The lower metal layer 210 may include at least one of Al, platinum (Pt), palladium (Pd), silver (Ag), magnesium (Mg), gold (Au), nickel (Ni), neodymium (Nd), iridium (Ir), chromium (Cr), lithium (Li), calcium (Ca), Mo, and Cu. The lower metal layer 210 may improve characteristics of the transistor TFT.

A first insulating layer IL1 may be disposed on the lower metal layer 210. In detail, the first insulating layer IL1 may be formed or disposed on an entirety of the surface of the substrate 100 so as to cover the lower metal layer 210. The first insulating layer IL1 may be disposed under the storage capacitor Cst and the pad PD. The first insulating layer IL1 may include an inorganic material, such as silicon oxide, silicon nitride, and/or silicon oxynitride. The first insulating layer IL1 may increase the smoothness of an upper surface of the substrate 100, or may prevent or reduce the penetration of impurities from the substrate 100 into the semiconductor layer 221 of the transistor TFT.

The second insulating layer IL2 may be disposed on the gate electrode 222. In detail, the second insulating layer IL2 may be formed or disposed on an entirety of the surface of the substrate 100 so as to cover the gate electrode 222. Accordingly, the first connection electrode 430 and the second connection electrode 440 may be disposed on the second insulating layer IL2. The second insulating layer IL2 may cover the first electrode 310, and the second electrode 420 and the pad PD may be disposed on the second insulating layer IL2. The second insulating layer IL2 may include an inorganic material, such as silicon oxide, silicon nitride, and/or silicon oxynitride. In an alternative embodiment, the second insulating layer IL2 may include an organic material, such as acryl, benzocyclobutene ("BCB"), or hexamethyldisiloxane ("HMDSO"). In this case, the upper surface of the second insulating layer IL2 (in a +z direction) may be flat.

A third insulating layer IL3 may be disposed on the first connection electrode 430 and the second connection electrode 440. In detail, the third insulating layer IL3 may be formed or disposed on an entirety of the surface of the substrate 100 so as to cover the first connection electrode 430 and the second connection electrode 440. The third insulating layer IL3 may cover the second electrode 420. The third insulating layer IL3 may include an inorganic material, such as silicon oxide, silicon nitride, and/or silicon oxynitride.

An organic insulating layer OL may be disposed on the third insulating layer IL3. In an embodiment, as shown in FIG. 4, when the organic light-emitting diode OLED is disposed over the transistor TFT, the organic insulating layer OL may substantially planarize the upper portion of a protective layer covering the transistor TFT, for example. The organic insulating layer OL may include an organic material, such as acryl, BCB, or HMDSO. In FIG. 4, the organic insulating layer OL has a single-layered structure, but the organic insulating layer OL may be variously modified. In an embodiment, the organic insulating layer OL may have a multi-layered structure, for example.

A display element may be disposed on the organic insulating layer OL of the substrate 100. The organic light-emitting diode OLED as shown in FIG. 4 may be used as the display element. The organic light-emitting diode OLED may include the pixel electrode 510, the opposite electrode 530, and an intermediate layer 520 arranged therebetween and including an emission layer ("EML"), for example. As shown in FIG. 4, the pixel electrode 510 may contact one of the first connection electrode 430 and the second connection electrode 440 through an opening defined in the organic insulating layer OL to be electrically connected to the transistor TFT. The pixel electrode 510 may include a light-transmitting conductive layer and a reflective layer, the light-transmitting conductive layer including light-transmitting conductive oxide, such as indium tin oxide ("ITO"), indium oxide ($In_2O_3$), or indium zinc oxide ("IZO"), and the reflective layer including metal, such as Al or Ag. In an embodiment, the pixel electrode 510 may have a three-layered structure of ITO/Ag/ITO.

The intermediate layer 520 of the organic light-emitting diode OLED may include a low-molecular weight material or a polymer material. When the intermediate layer 520 includes a low-molecular weight material, the intermediate layer 520 may have a single-layered structure or a multi-layered structure in which a hole injection layer ("HIL"), a hole transport layer ("HTL"), an EML, an electron transport layer ("ETL"), an electron injection layer ("EIL"), or the like are stacked, and may include various organic materials, such as copper phthalocyanine (CuPc), N,N'-di(naphthalene-1-yl)-N,N'-diphenyl-benzidine ("NPB"), or tris-8-hydroxyquinoline aluminum ($Alq_3$). The above layers may be formed through vacuum deposition.

When the intermediate layer 520 includes a polymer material, the intermediate layer 520 may have a structure including an HTL and an EML. In this case, the HTL may include poly(3,4-ethylenedioxythiophene) ("PEDOT"), and the EML may include a polymer material, such as a polyphenylenevinylene ("PPV")-based material or a polyfluorene-based material. The intermediate layer 520 may be formed by screen printing, inkjet printing, laser-induced thermal imaging ("LITI"), or the like.

However, the intermediate layer 520 is not limited thereto, and may have various structures. In addition, the intermediate layer 520 may include a layer that is a single body over a plurality of pixel electrodes 510, or may include a layer patterned to correspond to each of the plurality of pixel electrodes 510.

The opposite electrode 530 may be disposed over the display area DA, and may cover the display area DA, as shown in FIG. 4. That is, the opposite electrode 530 may be formed or provided as a single body over a plurality of organic light-emitting diodes OLED to correspond to a plurality of pixel electrodes 510. The opposite electrode 530 may include a light-transmitting conductive layer including ITO, $In_2O_3$, or IZO, and may include a semi-transmissive layer including metal, such as Al or Ag. In an embodiment, the opposite electrode 530 may be a semi-transmissive layer including Ag, for example.

A pixel-defining layer UIL may be disposed on the organic insulating layer OL. The pixel-defining layer UIL defines pixels by including an opening corresponding to each of the pixels, that is, an opening exposing at least a central portion of the pixel electrode 510. In addition, as shown in FIG. 4, the pixel-defining layer UIL prevents an arc or the like from occurring at an edge of the pixel electrode 510 by increasing a distance between the edge of the pixel electrode 510 and the opposite electrode 530. The pixel-defining layer UIL may include an organic material, such as polyimide or HMDSO, for example.

Because the organic light-emitting diode OLED may be easily damaged by external moisture or oxygen, an encapsulation layer 600 may cover and protect the organic light-emitting diode OLED. The encapsulation layer 600 may cover the display area DA, and may extend to the outside of the display area DA. As shown in FIG. 4, the encapsulation layer 600 may include a first inorganic encapsulation layer 610, an organic encapsulation layer 620, and a second inorganic encapsulation layer 630.

The first inorganic encapsulation layer 610 may cover the opposite electrode 530, and may include silicon oxide, silicon nitride, and/or silicon oxynitride. When desired, other layers, such as a capping layer, may be arranged between the first inorganic encapsulation layer 610 and the opposite electrode 530. Because the first inorganic encapsulation layer 610 is formed or provided along a structure thereunder, as shown in FIG. 4, the first inorganic encapsulation layer 610 may have an upper surface that is not flat. The organic encapsulation layer 620 may cover the first inorganic encapsulation layer 610, and may have an approximately flat upper surface, unlike the first inorganic encapsulation layer 610. In detail, the organic encapsulation layer 620 may have an approximately flat upper surface in a portion corresponding to the display area DA. The organic encapsulation layer 620 may include at least one of polyethylene terephthalate, polyethylene naphthalate, polycarbonate, polyimide, polyethylene sulfonate, polyoxymethylene, polyarylate, and HMDSO. The second inorganic encapsulation layer 630 may cover the organic encapsulation layer 620, and may include silicon oxide, silicon nitride, and/or silicon oxynitride. The second inorganic encapsulation layer 630 may contact the first inorganic encapsulation layer 610 at an edge of the second inorganic encapsulation layer 630 arranged outside the display area DA, and thus may prevent the organic encapsulation layer 620 from being exposed to the outside.

As described above, because the encapsulation layer 600 includes the first inorganic encapsulation layer 610, the organic encapsulation layer 620, and the second inorganic encapsulation layer 630, even when a crack occurs in the encapsulation layer 600, due to the above multi-layered structure, the crack may not be connected between the first inorganic encapsulation layer 610 and the organic encapsulation layer 620 or between the organic encapsulation layer 620 and the second inorganic encapsulation layer 630. Accordingly, the formation of a path through which external moisture or oxygen penetrates into the display area DA may be prevented or reduced.

The pad PD may be arranged in the peripheral area PA. As shown in FIG. 4, the pad PD may be disposed over the substrate 100, and before the pad PD is formed, at least one insulating layer may be disposed on the substrate 100. In detail, the first insulating layer IL1 and the second insulating layer IL2 may be disposed on the substrate 100, and the pad PD may be disposed on the first insulating layer IL1 and the second insulating layer IL2. The pad PD may include the same material as that of the first connection electrode 430. In detail, the pad PD may include a conductive material, such as Mo, Al, Cu, or Ti, and may have a single-layered structure or a multi-layered structure including the above material. In an embodiment, the pad PD may have a multi-layered structure of Ti/Al/Ti, for example.

The bump BP of the electronic chip package 1010 may be disposed over the pad PD. In detail, when viewed from a direction perpendicular to the substrate 100, the bump BP may be disposed over the pad PD to overlap the pad PD. In FIG. 4, the bump BP completely overlaps the pad PD, but the disclosure is not limited thereto. In an embodiment, when viewed from the direction perpendicular to the substrate 100, a portion of the bump BP may overlap the pad PD, for example.

First connection conductive particles 1310 and second connection conductive particles 1320 may be arranged between the pad PD and the bump BP. The first connection conductive particle 1310 may have an interface therein. In detail, the first connection conductive particle 1310 may include a first conductive particle 1210 and a second conductive particle 1220 that are bonded to each other. In this case, the first conductive particle 1210 may be bonded to the second conductive particle 1220 by surface contact. Accordingly, an interface may be formed between the first conductive particle 1210 and the second conductive particle 1220. That is, the first connection conductive particle 1310 may have an interface therein.

However, the disclosure is not limited thereto. In an embodiment, the first connection conductive particle 1310 may not have an interface therein, for example. As described below, in a process of forming the first connection conductive particle 1310 by the first conductive particle 1210 and the second conductive particle 1220, heat may be applied to the pad PD and the bump BP. Even in a case where the first conductive particle 1210 is in surface contact with the second conductive particle 1220 during a manufacturing process, when the pad PD and the bump BP do not have a uniform temperature, that is, when the temperature is different for each position of the pad PD and the bump BP, excessive heat that melts the first conductive particle 1210 and the second conductive particle 1220 may be applied to the pad PD and the bump BP. In this case, because the first conductive particle 1210 and the second conductive particle 1220 melt to form a single body, the first connection conductive particle 1310 formed through the above process may not have an interface therein.

The first connection conductive particle 1310 may electrically connect the pad PD to the bump BP. In detail, the first conductive particle 1210 included in the first connection conductive particle 1310 may contact the pad PD, and the second conductive particle 1220 included in the first connection conductive particle 1310 may contact the bump BP. Accordingly, the pad PD may be electrically connected to the bump BP through the first connection conductive particle 1310 including the first conductive particle 1210 and the second conductive particle 1220 in surface contact with each other. Because the first connection conductive particles 1310 and the second connection conductive particles 1320 are simultaneously in contact with the pads PD and the bumps BP, the pad PD may be electrically connected to the bump BP.

The second connection conductive particle 1320 may not have an interface therein. That is, the second connection conductive particle 1320 may be a single body. The second connection conductive particle 1320 may include the same material as that of the first conductive particle 1210. In an alternative embodiment, the second connection conductive particle 1320 may include the same material as that of the second conductive particle 1220. That is, the second connection conductive particle 1320 may be the first conductive particle 1210 that is not welded to the second conductive particle 1220, or may be the second conductive particle 1220 that is not welded to the first conductive particle 1210. This will be described below in detail. Unlike the first connection conductive particle 1310 having no interface therein, the second connection conductive particle 1320 may have an area that is less than an area of the first connection conductive particle 1310 having no interface therein, when viewed from the direction perpendicular to the substrate 100. This will be described below in detail.

Figure 5:
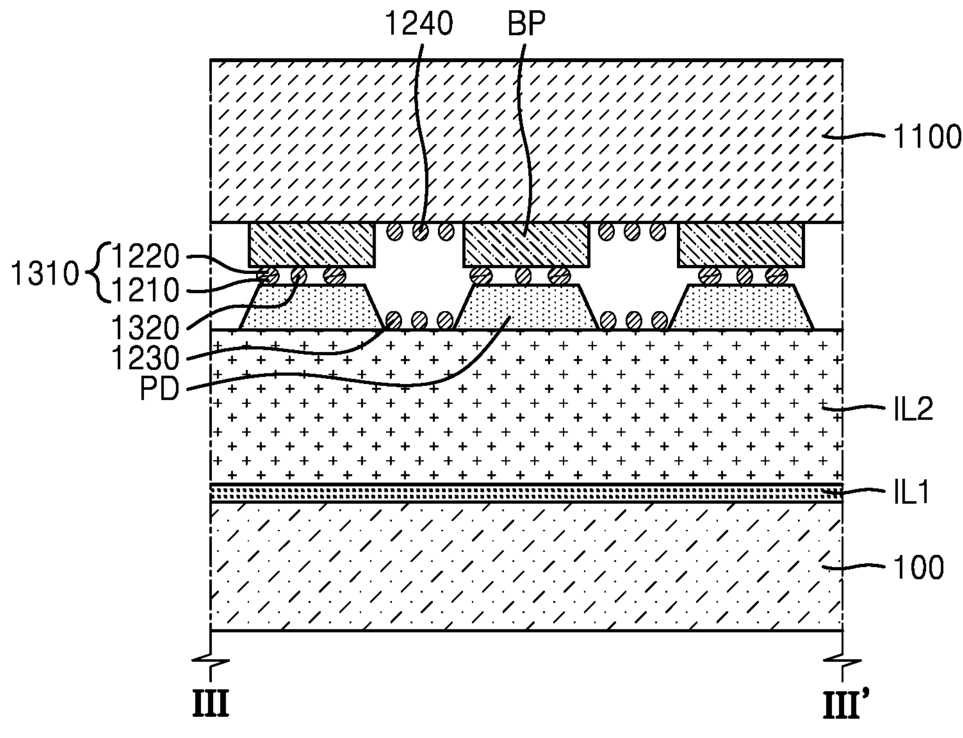
FIG. 5 is a cross-sectional view schematically illustrating an embodiment of a cross-section of the display apparatus taken along line III-III' of FIG. 2.

As shown in FIG. 5, which is a cross-sectional view schematically illustrating a cross-section of the display apparatus 1 taken along line III-III' of FIG. 2, a third conductive particle 1230 may be arranged in an area between the pads PD of the substrate 100. As described below, the third conductive particle 1230 may be simultaneously formed of the same material as that of the first conductive particle 1210 included in the first connection conductive particle 1310. Accordingly, the third conductive particle 1230 may include the same material as that of the first conductive particle 1210. That is, the third conductive particle 1230 may be the first conductive particle 1210 that is not welded to the second conductive particle 1220, and may be the first conductive particle 1210 arranged in the area between the pads PD of the substrate 100.

A fourth conductive particle 1240 may be arranged in an area between the bumps BP of the body 1100. As described below, the fourth conductive particle 1240 may be simultaneously formed of the same material as that of the second conductive particle 1220 included in the first connection conductive particle 1310. Accordingly, the fourth conductive particle 1240 may include the same material as that of the second conductive particle 1220. That is, the fourth conductive particle 1240 may be the second conductive particle 1220 that is not welded to the first conductive particle 1210, and may be the second conductive particle 1220 arranged in the area between the bumps BP of the body 1100.

The display apparatus 1 has been described above, but the disclosure is not limited thereto. It may be stated that a method of manufacturing the display apparatus 1 also falls within the scope of the disclosure. Hereinafter, the method of manufacturing the display apparatus 1 is described.

FIGS. 6 to 11 are cross-sectional views schematically illustrating a process of manufacturing a portion of the display apparatus 1 of FIG. 4. In detail, FIGS. 6 to 11 are cross-sectional views schematically illustrating a bonding process between the pad PD and the bump BP of the display apparatus 1 of FIG. 4.

Figure 6:
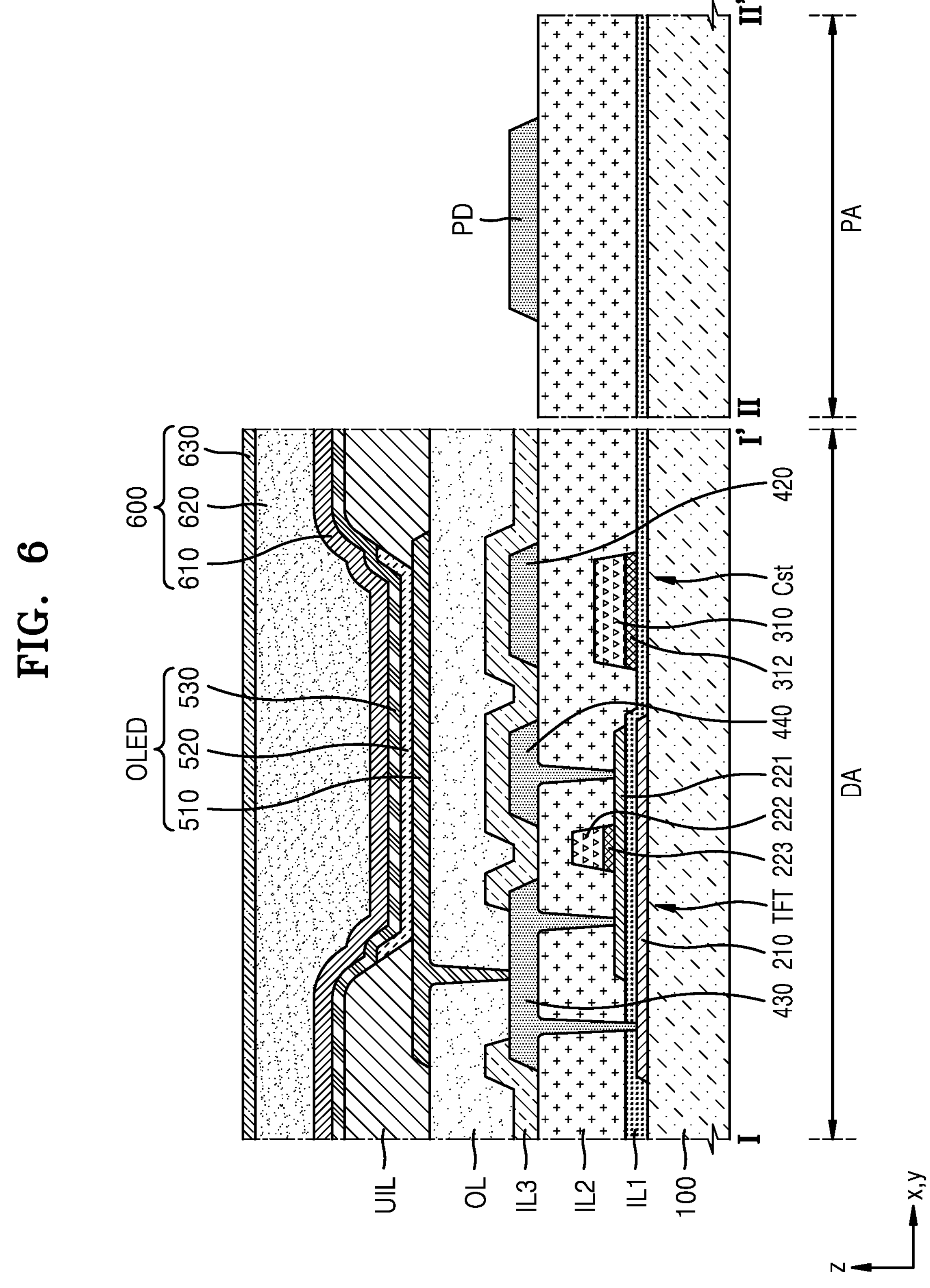

First, as shown in FIG. 6, the pad PD may be formed or provided in the peripheral area PA of the substrate 100. The pad PD may be simultaneously formed of the same material as that of the first connection electrode 430, the second connection electrode 440, and the second electrode 420. In an embodiment, a pad-forming layer (not shown) may be formed or disposed on the substrate 100 by depositing a pad-forming material on an entirety of the surface of the substrate 100 in a chamber by sputtering or the like. Thereafter, the pad-forming layer may be patterned so as to form the pad PD together with the first connection electrode 430, the second connection electrode 440, and the second electrode 420. Accordingly, the pad PD may include the same material and have the same layer structure as the first connection electrode 430, the second connection electrode 440, and the second electrode 420. In FIG. 6, the pad PD has a single-layered structure, but the disclosure is not limited thereto. In an embodiment, the pad PD may have a multi-layered structure including a plurality of sub-layers, for example.

In an alternative embodiment, the pad PD may include a first pad layer and a second pad layer, the first pad layer being simultaneously formed of the same material as that of the first connection electrode 430, the second connection electrode 440, and the second electrode 420, and the second pad layer being simultaneously formed of the same material as that of the pixel electrode 510 and disposed on the first pad layer. The pad PD may further include a third pad layer that is simultaneously formed of the same material as that of the gate electrode 222 and disposed under the first pad layer. In FIG. 6, for convenience, the pad PD includes only the first pad layer, but the disclosure is not limited thereto.

Figure 7A:
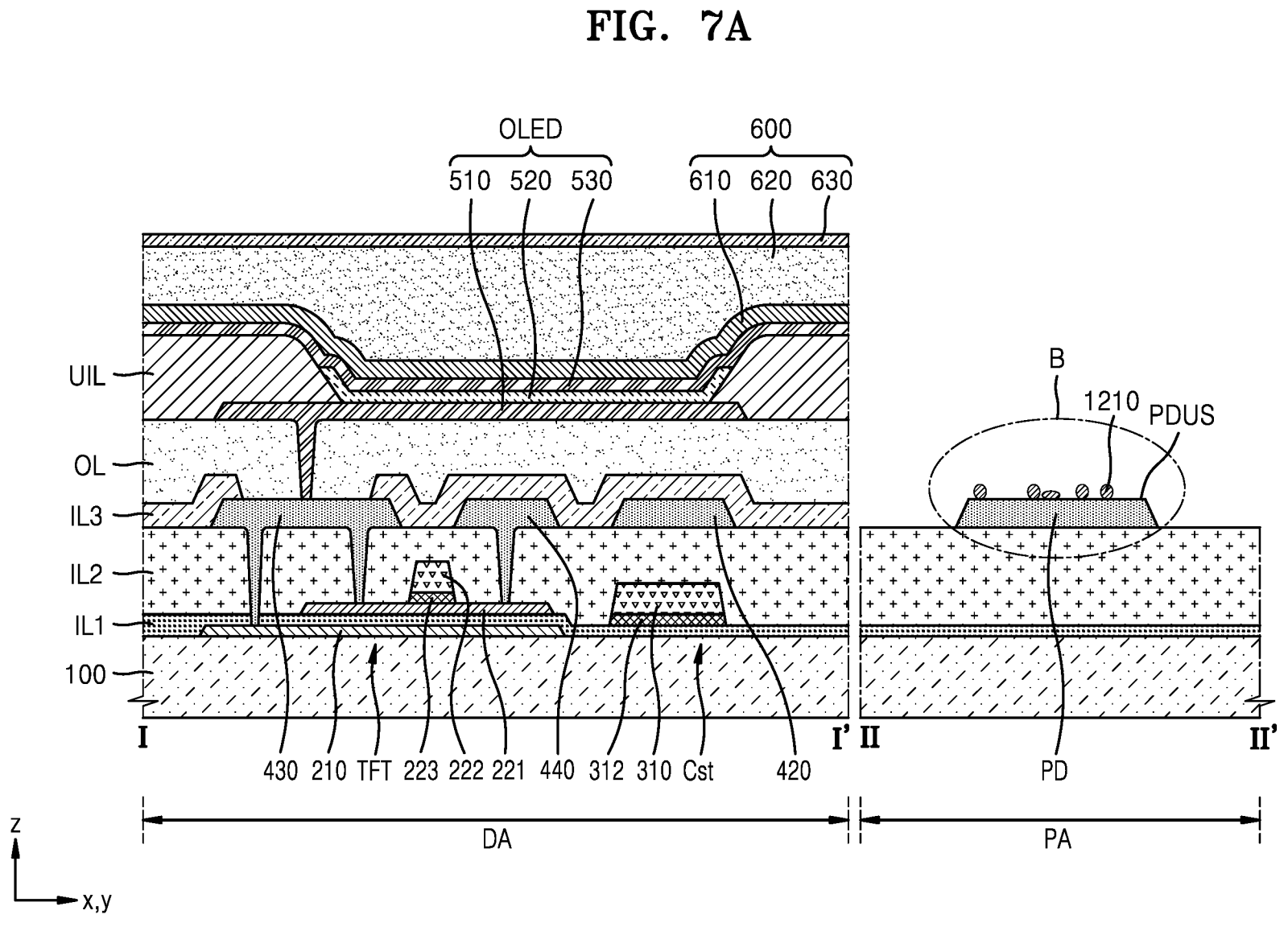
Figure 7B:
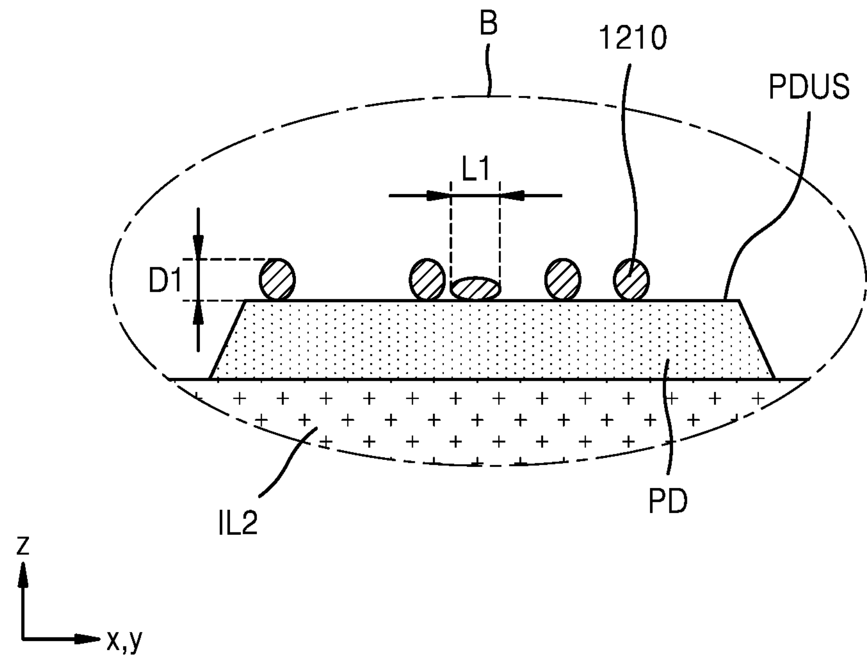

Subsequently, as shown in FIGS. 7A and 7B, the first conductive particles 1210 may be disposed on an upper surface PDUS of the pad PD. FIG. 7B is a cross-sectional view of an enlarged region B of FIG. 7A. In an embodiment, by placing a first conductive particle-forming material on the pad PD in a chamber by sputtering, which is a type of vacuum deposition, or the like, the first conductive particle 1210 may be disposed on the upper surface PDUS of the pad PD, for example.

The first conductive particle 1210 may be a material having conductivity. In an embodiment, the first conductive particle 1210 may include tin (Sn), for example. The first conductive particle 1210 may be formed by sputtering or the like, as described above.

When Sn is sputtered for a sufficient time or when Sn is sputtered at a sufficiently high temperature, a layer having a uniform thickness covers the pad PD. However, in the method of manufacturing a display apparatus in the illustrated embodiment, by sputtering a conductive particle-forming material for a short time, or by sputtering the conductive particle-forming material at a low temperature, the first conductive particles 1210 may be disposed apart from each other on the pad PD, instead of forming a layer having an approximately uniform thickness to cover the pad PD. As described above, when sputtering Sn, a period for sputtering Sn is may be several seconds, e.g., about 2 seconds to about 9 seconds, and a temperature at which Sn is sputtered may be room temperature, for example. In addition, a flow rate of argon gas may be about 200 standard cubic centimeters per minute (sccm), and power may be about 700 watts (W), for example.

The first conductive particle 1210 formed as described above may have a spherical or oval shape. When the first conductive particle 1210 has a spherical shape, a diameter D1 of the first conductive particle 1210 may be about 7 nanometers (nm) to about 24 nm. In an embodiment, the diameter D1 of the first conductive particle 1210 may be about 7 nm to about 11 nm, for example. When the first conductive particle 1210 has an oval shape, that is, when a cross-section of the first conductive particle 1210 has an oval shape, the cross-section being perpendicular to the substrate 100, a long axis length L1 of the oval shape may be about 7 nm to about 24 nm. In an embodiment, the long axis length L1 of the oval shape may be about 7 nm to about 11 nm, for example.

Figure 8:
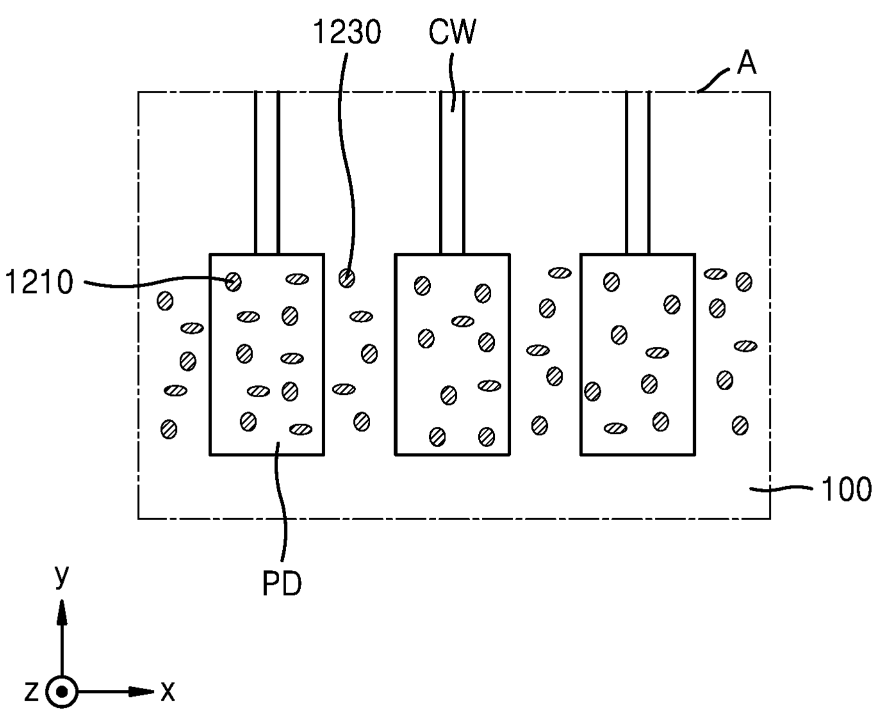

The first conductive particle 1210 may be formed or disposed over the entirety of the area where the plurality of pads PD is arranged in the peripheral areas PA of the substrate 100. In this case, as shown in FIG. 8, which is a plan view schematically illustrating a portion of the display apparatus 1 that is being manufactured in an embodiment, a plurality of conductive particles may also be formed in the area between the pads PD of the substrate 100. In detail, a plurality of third conductive particles 1230 may be arranged in an area between the pads PD of the second insulating layer IL2. The thickness of the pad PD may be several micrometers (μm) to several tens of μm, and a distance between the pads PD may also be several μm to several tens of μm. Accordingly, the thickness of the pad PD or the distance between the pads PD may be significantly greater than the diameter D1 or the long axis length L1 of the first conductive particle 1210. Accordingly, even when the third conductive particles 1230 are arranged between the pads PD, an adjacent pair of the pads PD may not be electrically connected to each other. Thus, a short circuit may be prevented from occurring between the adjacent pair of the pads PD.

Figure 9A:
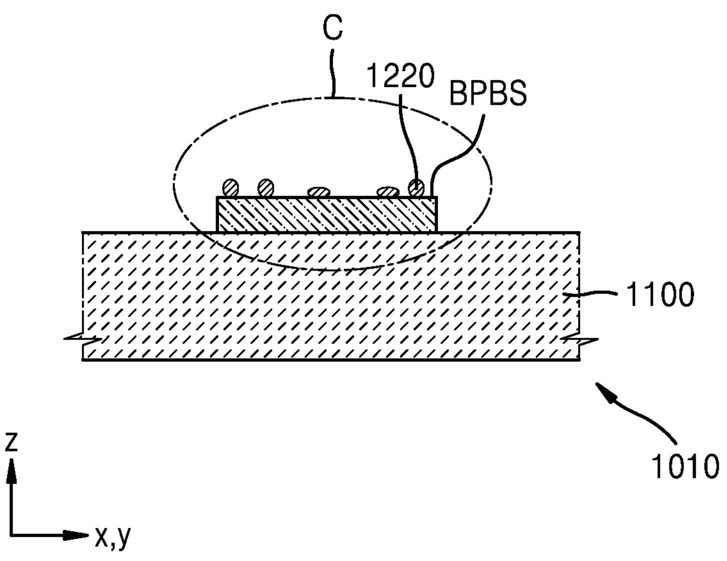
Figure 9B:
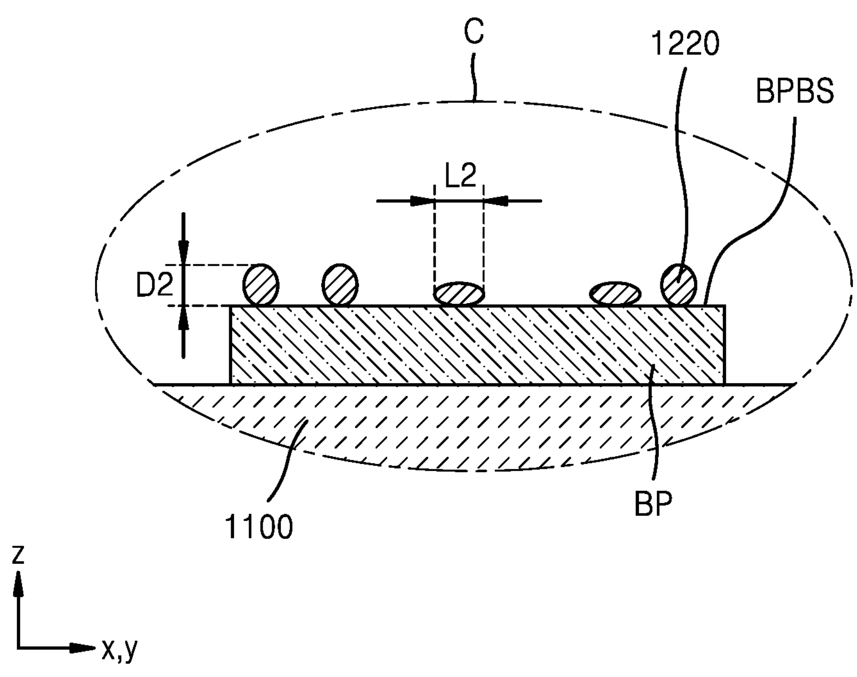

Subsequently, as shown in FIGS. 9A and 9B, the second conductive particles 1220 may be disposed on a bottom surface BPBS of the bump BP included in the electronic chip package 1010. FIG. 9B is a cross-sectional view of an enlarged region C of FIG. 9A. As described above, the electronic chip package 1010 includes the body 1100 and the bumps BP disposed on the bottom surface thereof. In FIGS. 9A and 9B, the electronic chip package 1010 is turned upside down such that the bumps BP of the electronic chip package 1010 face upward. When the electronic chip package 1010 is turned upside down, that is, when the electronic chip package 1010 is arranged such that the bottom surface BPBS of the bump BP included in the electronic chip package 1010 faces the +z direction, the second conductive particles 1220 may be disposed on the bottom surface BPBS of the bump BP. The second conductive particle 1220 may be a material having conductivity. In an embodiment, the second conductive particle 1220 may include Sn, for example. That is, the first conductive particle 1210 and the second conductive particle 1220 may include the same material as one another. Accordingly, the first conductive particle 1210 and the second conductive particle 1220 may each include Sn. Like the first conductive particle 1210, the second conductive particle 1220 may be formed by sputtering or the like on the bottom surface BPBS of the bump BP included in the electronic chip package 1010. That is, the second conductive particles 1220 may be disposed on the bottom surface BPBS of the bump BP included in the electronic chip package 1010.

As described above with respect to the first conductive particle 1210, in the method of manufacturing a display apparatus in the illustrated embodiment, by sputtering a conductive particle-forming material for a short time, or by sputtering the conductive particle-forming material at a low temperature, the second conductive particles 1220 may be disposed apart from each other on the bump BP, instead of forming a layer having an approximately uniform thickness to cover the bump BP. In an embodiment, when sputtering Sn, a period for sputtering Sn may be about 2 seconds to about 9 seconds, for example, and a temperature at which Sn is sputtered may be room temperature, for example. In addition, a flow rate of argon gas may be about 200 sccm, and power may be about 700 W, for example.

The second conductive particle 1220 formed as described above may have a spherical or oval shape. When the second conductive particle 1220 has a spherical shape, a diameter D2 of the second conductive particle 1220 may be about 7 nm to about 24 nm. In an embodiment, the diameter D2 of the second conductive particle 1220 may be about 7 nm to about 11 nm, for example. When the second conductive particle 1220 has an oval shape, that is, when a cross-section of the second conductive particle 1220 has an oval shape, the cross-section being perpendicular to the substrate 100, a long axis length L2 of the oval shape may be about 7 nm to about 24 nm. In an embodiment, the long axis length L2 of the oval shape may be about 7 nm to about 11 nm, for example.

Figure 10:
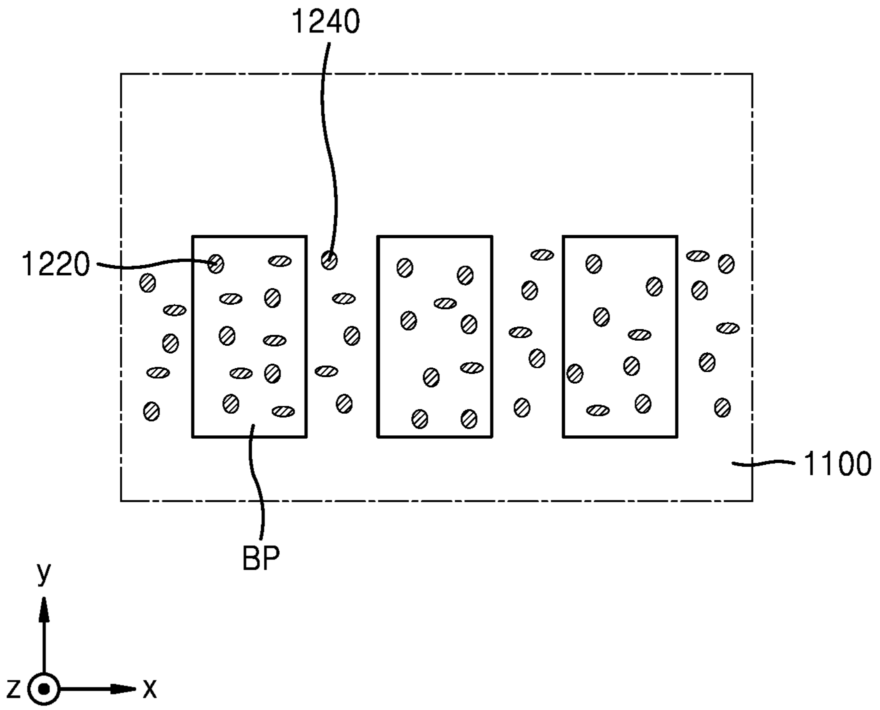

The second conductive particle 1220 may be formed over the entirety of the area where the plurality of bumps BP is arranged in the body 1100 of the electronic chip package 1010. In this case, as shown in FIG. 10, which is a plan view schematically illustrating a portion of the display apparatus 1 that is being manufactured in an embodiment, a plurality of conductive particles may also be formed in the area between the bumps BP of the electronic chip package 1010. In detail, a plurality of fourth conductive particles 1240 may be arranged in an area between the bumps BP of the body 1100. The thickness of the bump BP may be several μm to several tens of μm, and a distance between the bumps BP may also be several μm to several tens of μm. Accordingly, the thickness of the bump BP or the distance between the bumps BP may be significantly greater than the diameter D2 or the long axis length L2 of the second conductive particle 1220. Accordingly, even when the fourth conductive particles 1240 are arranged between the bumps BP, an adjacent pair of the bumps BP may not be electrically connected to each other. Thus, a short circuit may be prevented from occurring between the adjacent pair of the bumps BP.

Subsequently, as shown in FIG. 11, the electronic chip package 1010 (refer to FIG. 9B) may be disposed on the display panel 10 (refer to FIGS. 1A to 2) such that the bottom surface BPBS of the bump BP faces the upper surface PDUS of the pad PD. In detail, the electronic chip package 1010 may be disposed on the display panel 10 such that the bottom surface BPBS of the bump BP faces a −z direction. In addition, the electronic chip package 1010 may be disposed on the display panel 10 such that at least some of the second conductive particles 1220 disposed on the bottom surface BPBS of the bump BP are disposed over at least some of the first conductive particles 1210 disposed on the upper surface PDUS of the pad PD. Thereafter, the at least some of the first conductive particles 1210 may be brought into contact with the at least some of the second conductive particles 1220 to electrically connect the pad PD to the bump BP. In detail, by welding the first conductive particle 1210 and the second conductive particle 1220 in contact with each other to form a first connection conductive particle, the pad PD may be electrically connected to the bump BP.

In an embodiment, the display panel 10 and the electronic chip package 1010 may be heated to a preset temperature, for example. Accordingly, the first conductive particle 1210 of the display panel 10 and the second conductive particle 1220 of the electronic chip package 1010 may be heated to the preset temperature. When the size of a particle including metal is less than or equal to a predetermined size, the particle may have liquid-like properties at a temperature lower than the melting point of general metal (e.g., metal in a bulk form). In an embodiment, the particle may be softened, for example. As used herein, the expression "A is softened" may indicate that although A is in a solid state, A has some liquid properties, and becomes soft without being completely melted.

When the first conductive particle 1210 includes Sn and the size of the first conductive particle 1210 is less than a predetermined size, the first conductive particle 1210 may be softened at a temperature lower than the melting point of general Sn (e.g., Sn in a bulk form). In an embodiment, when the first conductive particle 1210 has a spherical shape and the diameter D1 of the first conductive particle 1210 is about 7 nm to about 24 nm, the first conductive particle 1210 may be softened at a temperature greater than or equal to about 120 degrees Celsius (° C.) and less than about 210° C., for example. In detail, when the first conductive particle 1210 has a spherical shape and the diameter D1 of the first conductive particle 1210 is about 7 nm to about 11 nm, the first conductive particle 1210 may be softened at a temperature greater than or equal to about 120° C. and less than about 170° C. When the first conductive particle 1210 has a spherical shape and the diameter D1 of the first conductive particle 1210 is greater than about 11 nm and less than or equal to about 24 nm, the first conductive particle 1210 may be softened at a temperature greater than about 170° C. and less than about 210° C.

When the cross-section of the first conductive particle 1210 has an oval shape, the cross-section being perpendicular to the substrate 100, and the long axis length L1 of the oval shape is about 7 nm to about 24 nm, the first conductive particle 1210 may be softened at a temperature greater than or equal to about 120° C. and less than about 210° C. In detail, when the cross-section of the first conductive particle 1210 has an oval shape, the cross-section being perpendicular to the substrate 100, and the long axis length L1 of the oval shape is about 7 nm to about 11 nm, the first conductive particle 1210 may be softened at a temperature greater than or equal to about 120° C. and less than about 170° C. When the cross-section of the first conductive particle 1210 has an oval shape, the cross-section being perpendicular to the substrate 100, and the long axis length L1 of the oval shape is greater than about 11 nm and less than or equal to about 24 nm, the first conductive particle 1210 may be softened at a temperature greater than or equal to about 170° C. and less than about 210° C.

Because the above descriptions provided with respect to a relationship between the diameter D1 or the long axis length L1 of the first conductive particle 1210 and a softening temperature of the first conductive particle 1210 may apply to a relationship between the diameter D2 or the long axis length L2 of the second conductive particle 1220 and a softening temperature of the second conductive particle 1220, redundant descriptions in this regard are omitted.

In detail, when the diameter D2 of the second conductive particle 1220 having a spherical shape is about 7 nm to about 24 nm, the second conductive particle 1220 may be softened at a temperature greater than or equal to about 120° C. and less than about 210° C., and when the diameter D2 of the second conductive particle 1220 having a spherical shape is about 7 nm to about 11 nm, the second conductive particle 1220 may be softened at a temperature greater than or equal to about 120° C. and less than about 170° C. When the cross-section of the second conductive particle 1220 has an oval shape, the cross-section being perpendicular to the substrate 100, and the long axis length L2 of the oval shape of the second conductive particle 1220 is about 7 nm to about 24 nm, the second conductive particle 1220 may be softened at a temperature greater than or equal to about 120° C. and less than about 210° C. In addition, when the long axis length L2 of the oval shape of the second conductive particle 1220 is about 7 nm to about 11 nm, the second conductive particle 1220 may be softened at a temperature greater than or equal to about 120° C. and less than about 170° C.

When the first conductive particle 1210 is softened, a material included in the first conductive particle 1210 may diffuse into a material included in the second conductive particle 1220, so that the first conductive particle 1210 may be welded to the second conductive particle 1220. When second conductive particle 1220 is softened, the material included in the second conductive particle 1220 may diffuse into the material included in the first conductive particle 1210, so that the first conductive particle 1210 may be welded to the second conductive particle 1220. When the first conductive particle 1210 and the second conductive particle 1220 are softened, the material included in the first conductive particle 1210 may diffuse into the material included in the second conductive particle 1220, and the material included in the second conductive particle 1220 may diffuse into the material included in the first conductive particle 1210. Accordingly, the first conductive particle 1210 may be welded to the second conductive particle 1220.

Accordingly, when the first conductive particle 1210 has a spherical shape and the diameter D1 of the first conductive particle 1210 is about 7 nm to about 24 nm, the first conductive particle 1210 may be welded to the second conductive particle 1220 at a temperature greater than or equal to about 120° C. and less than about 210° C. In detail, when the diameter D1 of the first conductive particle 1210 is about 7 nm to about 11 nm, the first conductive particle 1210 may be welded to the second conductive particle 1220 at a temperature greater than or equal to about 120° C. and less than about 170° C. When the diameter D1 of the first conductive particle 1210 is greater than about 11 nm and less than or equal to about 24 nm, the first conductive particle 1210 may be welded to the second conductive particle 1220 at a temperature greater than or equal to about 170° C. and less than about 210° C.

When the cross-section of the first conductive particle 1210 has an oval shape, the cross-section being perpendicular to the substrate 100, and the long axis length L1 of the oval shape of the first conductive particle 1210 is about 7 nm to about 24 nm, the first conductive particle 1210 may be welded to the second conductive particle 1220 at a temperature greater than or equal to about 120° C. and less than about 210° C. In detail, when the long axis length L1 of the oval shape of the first conductive particle 1210 is about 7 nm to about 11 nm, the first conductive particle 1210 may be welded to the second conductive particle 1220 at a temperature greater than or equal to about 120° C. and less than about 170° C. When the long axis length L1 of the oval shape of the first conductive particle 1210 is greater than about 11 nm and less than or equal to about 24 nm, the first conductive particle 1210 may be welded to the second conductive particle 1220 at a temperature greater than or equal to about 170° C. and less than about 210° C.

When the second conductive particle 1220 has a spherical shape and the diameter D2 of the second conductive particle 1220 is about 7 nm to about 24 nm, the first conductive particle 1210 may be welded to the second conductive particle 1220 at a temperature greater than or equal to about 120° C. and less than about 210° C. In detail, when the diameter D2 of the second conductive particle 1220 is about 7 nm to about 11 nm, the first conductive particle 1210 may be welded to the second conductive particle 1220 at a temperature greater than or equal to about 120° C. and less than about 170° C. When the diameter D2 of the second conductive particle 1220 is greater than about 11 nm and less than or equal to about 24 nm, the first conductive particle 1210 may be welded to the second conductive particle 1220 at a temperature greater than or equal to about 170° C. and less than about 210° C.

When the cross-section of the second conductive particle 1220 has an oval shape, the cross-section being perpendicular to the substrate 100, and the long axis length L2 of the oval shape of the second conductive particle 1220 is about 7 nm to about 24 nm, the first conductive particle 1210 may be welded to the second conductive particle 1220 at a temperature greater than or equal to about 120° C. and less than about 210° C. In detail, when the long axis length L2 of the oval shape of the second conductive particle 1220 is about 7 nm to about 11 nm, the first conductive particle 1210 may be welded to the second conductive particle 1220 at a temperature greater than or equal to about 120° C. and less than about 170° C. When the long axis length L2 of the oval shape of the second conductive particle 1220 is greater than about 11 nm and less than or equal to about 24 nm, the first conductive particle 1210 may be welded to the second conductive particle 1220 at a temperature greater than or equal to about 170° C. and less than about 210° C.

When the diameter D1 or the long axis length L1 of the first conductive particle 1210 is greater than about 24 nm, a temperature for softening the first conductive particle 1210 is excessively high. Accordingly, in a process of applying excessive heat to the first conductive particle 1210 to soften the first conductive particle 1210, the display panel 10 may be damaged. When the diameter D1 or the long axis length L1 of the first conductive particle 1210 is less than about 7 nm, a contact area between the first conductive particle 1210 and the second conductive particle 1220 is excessively small. Accordingly, bonding between the pad PD and the bump BP may be insufficient, or the pad PD may not be electrically connected to the bump BP. Because the above descriptions provided with respect to the diameter D1 or the long axis length L1 of the first conductive particle 1210 may apply to the relationship between the diameter D2 or the long axis length L2 of the second conductive particle 1220 and the softening temperature of the second conductive particle 1220, redundant descriptions in this regard are omitted.

Because the first conductive particle 1210 is welded to the second conductive particle 1220 when the first conductive particle 1210 contacts the second conductive particle 1220, the first connection conductive particle 1310 may have an interface therein. The interface may be a boundary between the first conductive particle 1210 and the second conductive particle 1220 that are included in the first connection conductive particle 1310 and bonded to each other. However, the disclosure is not limited thereto. In an embodiment, when the pad PD and the bump BP that have been heated do not have a uniform temperature, that is, when the temperature is different for each position of the pad PD and the bump BP, excessive heat that melts the first conductive particle 1210 and the second conductive particle 1220 may be applied to the first conductive particle 1210 and the second conductive particle 1220, for example. In this case, because the first conductive particle 1210 and the second conductive particle 1220 melt to form a single body, the first connection conductive particle 1310 formed through the above process may not have an interface therein.

The second conductive particle 1220 may not be disposed under some of a plurality of first conductive particles 1210, and the first conductive particle 1210 may not be disposed over some of a plurality of second conductive particles 1220. In this case, the first conductive particle 1210 that does not have the second conductive particle 1220 disposed thereunder may not be welded to the second conductive particle 1220, and the second conductive particle 1220 that does not have the first conductive particle 1210 disposed thereunder may not be welded to the first conductive particle 1210. In other words, the above-described second connection conductive particle 1320 may be the first conductive particle 1210 that is not welded to the second conductive particle 1220, or may be the second conductive particle 1220 that is not welded to the first conductive particle 1210. Accordingly, the second connection conductive particle 1320 may not have an interface therein, and may be a single body. Accordingly, the second connection conductive particle 1320 may include the same material as that of the first conductive particle 1210. In an alternative embodiment, the second connection conductive particle 1320 may include the same material as that of the second conductive particle 1220.

When viewed from the direction perpendicular to the substrate 100, an area of the first connection conductive particle 1310 may be greater than an area of the second connection conductive particle 1320. As described above, in an operation of electrically connecting the pad PD to the bump BP by bringing the first conductive particles 1210 into contact with the second conductive particles 1220, the first conductive particle 1210 and the second conductive particle 1220 may be softened as heat is applied thereto, and the first conductive particle 1210 and the second conductive particle 1220 in contact with each other may be pressed by the weight of the electronic chip package 1010 and spread in a horizontal direction (e.g., a lateral direction) on the substrate 100. Accordingly, the length of the first connection conductive particle 1310 in the direction perpendicular to the substrate 100 may be similar to the length of the second connection conductive particle 1320 in the direction perpendicular to the substrate 100. As described above, the first connection conductive particle 1310 is formed by welding the first conductive particle 1210 to the second conductive particle 1220, and the second connection conductive particle 1320 may be the first conductive particle 1210 or the second conductive particle 1220. Accordingly, when viewed from the direction perpendicular to the substrate 100, the area of the first connection conductive particle 1310 may be greater than the area of the second connection conductive particle 1320.

In a comparative example, an anisotropic conductive film including conductive particles may be arranged between the pad PD and the bump BP to electrically connect the pad PD to the bump BP, and the pad PD and the bump BP may be bonded to each other by applying heat and/or pressure thereto in an environment of high temperature and high pressure. In this case, the display panel 10 may be damaged due to the environment of high temperature and high pressure, and manufacturing costs of the display apparatus 1 may increase because the anisotropic conductive film is desired.

However, in the method of manufacturing a display apparatus in the illustrated embodiment, the pad PD may be electrically connected to the bump BP by bringing the first conductive particles 1210 into contact with the second conductive particles 1220 at a lower temperature than when the anisotropic conductive film is used. In addition, a high-pressure environment may not be desired. Accordingly, the display panel 10 may be prevented from being damaged, and the manufacturing costs of the display apparatus 1 may be reduced because the anisotropic conductive film is not desired.

In addition, when the pad PD is electrically connected to the bump BP by the anisotropic conductive film, the conductive particles may be non-uniformly arranged inside the anisotropic conductive film. Accordingly, due to a portion of the anisotropic conductive film in which many of the conductive particles are distributed, an adjacent pair of the pads PD of the display panel 10 may be electrically connected to each other, and thus, a short circuit may occur. In an alternative embodiment, the bumps BP of the electronic chip package 1010 may be electrically connected not only to the pads PD of the display panel 10, which respectively correspond thereto, but also to the pads PD adjacent thereto, and thus, a short circuit may occur.

However, in the method of manufacturing a display apparatus in the illustrated embodiment, because the conductive particles are uniformly disposed on the pad PD and the bump BP, an adjacent pair of the pads PD of the display panel 10 may not be electrically connected to each other, and the bumps BP of the electronic chip package 1010 may not be electrically connected to the pads PD other than the pads PD of display panel 10, which respectively correspond thereto. That is, the occurrence of a short circuit in a pad portion may be reduced.

Although a case where the organic light-emitting diode OLED is arranged as a display element in the display area DA has been described above, the disclosure is not limited thereto. In an embodiment, it may be stated that a case where a liquid crystal display element or another element is provided as a display element also falls within the scope of the disclosure, for example. In addition, although it has been described above that the bumps BP of the electronic chip package 1010 are electrically connected to the pads PD, the disclosure is not limited thereto, and may have various modifications. In an embodiment, pads of a printed circuit board may also be electrically connected to the pads PD, for example.

As described above, in an embodiment, a display apparatus, in which the occurrence of a short circuit in a pad portion may be reduced, and a method of manufacturing the display apparatus may be implemented. However, the scope of the disclosure is not limited by these effects.

It should be understood that embodiments described herein should be considered in a descriptive sense only and not for purposes of limitation. Descriptions of features or advantages within each embodiment should typically be considered as available for other similar features or advantages in other embodiments. While embodiments have been described with reference to the drawing figures, it will be understood by those of ordinary skill in the art that various changes in form and details may be made therein without departing from the spirit and scope as defined by the following claims.

What is claimed is:

1. A method of manufacturing a display apparatus, the method comprising:

forming a pad in a peripheral area of a substrate in which a display area and the peripheral area outside the display area are defined;

disposing first conductive particles on a surface of the pad, each of the first conductive particles being individually disposed on the surface of the pad;

disposing second conductive particles on a surface of a bump included in an electronic chip package, the surface of the bump facing the surface of the pad, each of the second conductive particles being individually disposed on the surface of the bump; and electrically connecting the pad to the bump by bringing the first conductive particles into contact with the second conductive particles.

2. The method of claim 1, wherein the electrically connecting the pad to the bump comprises welding the first conductive particles to the second conductive particles.

3. The method of claim 2, wherein the first conductive particles comprises a same material as a material of the second conductive particles.

4. The method of claim 3, wherein the first conductive particles and the second conductive particles each comprise tin.

5. The method of claim 4, wherein, when the first conductive particles have a spherical shape, a diameter of the first conductive particles is about 7 nanometers to about 24 nanometers, and the electrically connecting the pad to the bump comprises welding the first conductive particles to the second conductive particles at a temperature greater than or equal to about 120 degrees Celsius and less than about 210 degrees Celsius.

6. The method of claim 5, wherein the diameter of the first conductive particles is about 7 nanometers to about 11 nanometers, and the electrically connecting the pad to the bump comprises welding the first conductive particles to the second conductive particles at a temperature greater than or equal to about 120 degrees Celsius and less than about 170 degrees Celsius.

7. The method of claim 4, wherein, when the second conductive particles have a spherical shape, a diameter of the second conductive particles is about 7 nanometers to about 24 nanometers, and the electrically connecting the pad to the bump comprises welding the first conductive particles to the second conductive particles at a temperature greater than or equal to about 120 degrees Celsius and less than about 210 degrees Celsius.

8. The method of claim 7, wherein the diameter of the second conductive particles is about 7 nanometers to about 11 nanometers, and the electrically connecting the pad to the bump comprises welding the first conductive particles to the second conductive particles at a temperature greater than or equal to about 120 degrees Celsius and less than about 170 degrees Celsius.

9. The method of claim 4, wherein, when a cross-section of the first conductive particles has an oval shape, the cross-section being perpendicular to the substrate, a long axis length of the oval shape is about 7 nanometers to about 24 nanometers, and the electrically connecting the pad to the bump comprises welding the first conductive particles to the second conductive particles at a temperature greater than or equal to about 120 degrees Celsius and less than about 210 degrees Celsius.

10. The method of claim 9, wherein the long axis length of the oval shape is about 7 nanometers to about 11 nanometers, and the electrically connecting the pad to the bump comprises welding the first conductive particles to the second conductive particles at a temperature greater than or equal to about 120 degrees Celsius and less than about 170 degrees Celsius.

11. The method of claim 4, wherein, when a cross-section of the second conductive particles has an oval shape, the cross-section being perpendicular to the substrate, a long axis length of the oval shape is about 7 nanometers to about 24 nanometers, and the electrically connecting the pad to the bump comprises welding the first conductive particles to the second conductive particles at a temperature greater than or equal to about 120 degrees Celsius and less than about 210 degrees Celsius.

12. The method of claim 11, wherein the long axis length of the oval shape is about 7 nanometers to about 11 nanometers, and the electrically connecting the pad to the bump comprises welding the first conductive particles to the second conductive particles at a temperature greater than or equal to about 120 degrees Celsius and less than about 170 degrees Celsius.

* * * * *